(12) United States Patent
Doyle

(10) Patent No.: US 6,927,619 B1
(45) Date of Patent: Aug. 9, 2005

(54) METHOD AND SYSTEM FOR REDUCING LEAKAGE CURRENT IN INTEGRATED CIRCUITS USING ADAPTIVELY ADJUSTED SOURCE VOLTAGES

(75) Inventor: James T. Doyle, Nederland, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 160 days.

(21) Appl. No.: 10/313,806

(22) Filed: Dec. 6, 2002

(51) Int. Cl.[7] ................................................. G05F 1/10
(52) U.S. Cl. ....................................... 327/534; 327/536
(58) Field of Search ................................. 327/530, 534, 327/535, 537, 538, 536

(56) References Cited

U.S. PATENT DOCUMENTS 6,175,251 B1 * 1/2001 Horiguchi et al. ............. 326/83
6,211,725 B1 * 4/2001 Kang ........................... 327/534
6,225,846 B1 * 5/2001 Wada et al. .................. 327/215
6,552,596 B2 * 4/2003 Cowles et al. ............... 327/318
6,559,708 B2 * 5/2003 Notani ......................... 327/537

* cited by examiner

Primary Examiner—Jeffrey Zweizig

(57) ABSTRACT

An apparatus for reducing leakage currents in an integrated circuit having logic gates containing PMOS devices and NMOS devices. The apparatus comprises a power management unit capable of: i) applying a fixed VDD supply voltage to body connections of said PMOS devices; ii) applying a fixed VSS supply voltage to body connections of said NMOS devices; iii) applying an adjustable PMOS source voltage to sources of said PMOS devices; and iv) applying an adjustable NMOS source voltage to sources of said NMOS devices.

21 Claims, 5 Drawing Sheets

METHOD AND SYSTEM FOR REDUCING LEAKAGE CURRENT IN INTEGRATED CIRCUITS USING ADAPTIVELY ADJUSTED SOURCE VOLTAGES

TECHNICAL FIELD OF THE INVENTION

The present invention relates generally to power regulation for integrated circuits and, more particularly, to a method and system for reducing leakage current in integrated circuits using adaptively adjusted source voltages.

BACKGROUND OF THE INVENTION

Business and consumers use a wide array of wireless devices, including cell phones, wireless local area network (LAN) cards, global positioning system (GPS) devices, electronic organizers equipped with wireless modems, and the like. The increased demand for wireless communication, and other mobile devices has created a corresponding demand for technical improvements to such devices. Generally speaking, more and more of the components of conventional radio receivers and transmitters are being fabricated in a single integrated circuit package.

One important aspect of wireless communication devices having integrated circuits is battery life. In order to maximize battery life for these wireless communication devices, much emphasis has been placed on minimizing power consumption in the integrated circuits of the wireless communication devices.

Conventional approaches to minimizing power consumption in integrated circuits include voltage scaling. Voltage scaling is useful for minimizing dynamic power consumption due to switching. However, voltage scaling does not provide much, if any, benefit for static power consumption due to leakage current. This causes problems in digital technologies that have been scaled to be smaller and smaller, resulting in more leaky circuits. In fact, the leakage current, which used to be a relatively small component of total power consumption, is actually dominating total power consumption for many deep submicron digital chips. A digital chip with several million transistors, for example, may have a DC leakage current of several milliamps, or even tens of milliamps, when the chip is in a standby mode. In typical mobile devices, this amount of leakage current, and its corresponding power consumption, is unacceptable.

Conventional approaches to minimizing power consumption in integrated circuits also include threshold scaling. Threshold scaling is useful for minimizing static power consumption due to leakage current. However, threshold scaling does not provide much, if any, benefit for dynamic power consumption due to switching.

Thus, in order to make use of both voltage scaling to minimize dynamic power consumption and threshold scaling to minimize static power consumption, one approach has been to incorporate switching software into the chip. This switching software determines the voltage and threshold needed to operate a particular task and switches the chip into a corresponding mode while that task is being performed. One drawback to this approach includes the use of a safety margin in the calculation of critical path delays when selecting the mode, which results in the chip possibly not operating at its optimum potential.

One recent solution to this problem uses adaptive voltage scaling and adaptive threshold scaling cooperatively based on a clock frequency for the corresponding chip as measured on the chip. With this approach, adaptive voltage scaling may be used to minimize dynamic power consumption at higher frequencies, while adaptive threshold scaling may be used to minimize static power consumption at lower frequencies, without the use of an arbitrary safety margin for critical path delays. This results in a minimization of average power consumption over all operating modes, which maximizes the battery life for the mobile device. However, leakage current in the active or operating mode remains a problem with this approach and limits the battery life.

One solution to the problem of leakage current was proposed in "Standby Power Management for an 0.18 µm Microprocessor," L. Clark et al., ISLPED02, 2002. This solution provides for moving the bulk relative to the source in transistors of the integrated circuit, while the sources are fixed at the supply rails. For p-channel devices, the bulk (or back) bias is derived from an additional power supply and the bias is developed from a linear regulator. On the negative rail, there are two conflicting references: one to a back bias generated by a charge pump and another that moves the source positive with respect to ground with a linear regulator. Both of these techniques are performed on-chip and suffer from process-inherent sensitivities, in addition to low quality analog process attributes of deep submicron processes such as leakage noise matching and the like. Also, because this approach is on-chip, an inability to easily scale for new technology is another disadvantage. Also, the use of a linear regulator does not allow total system power savings afforded by an external switching regulator.

SUMMARY OF THE INVENTION

In accordance with the present invention, a method and system for reducing leakage current in integrated circuits using adaptively adjusted source voltages are provided that substantially eliminate or reduce disadvantages and problems associated with conventional systems and methods. According to an exemplary embodiment, the adaptively adjusted source voltages may be generated by, for example, a single inductor, multiple output (SIMO) switching regulator. In particular, adaptively adjusted source voltages are generated off-chip, while the bodies are held at the rails, making scaling for new technology easier and removing process-inherent sensitivities associated with on-chip methods.

To address the above-discussed deficiencies of the prior art, it is a primary object of the present invention to provide a method for reducing leakage current in integrated circuits using adaptively adjusted source voltages, the integrated circuits comprising PMOS and NMOS devices. According to an advantageous embodiment of the present invention, the method comprises: 1) applying a fixed VDD supply voltage to the bodies of the PMOS devices; 2) applying a fixed VSS supply voltage to the bodies of the NMOS devices; 3) applying an adjustable PMOS source voltage to sources of the PMOS devices; and 4) applying an adjustable NMOS source voltage to sources of the NMOS devices.

According to one embodiment of the present invention (using, for example, a 0.13 µ CMOS process), the step of adjusting the adjustable PMOS source voltage to a first bias voltage that is +ΔV1 (e.g., +0.25V) volts above one-half of the fixed VDD supply voltage.

According to another embodiment of the present invention, the step of adjusting the adjustable NMOS source voltage to a second bias voltage that is −ΔV2 (e.g., −0.25V) volts below one-half of the fixed VDD supply.

According to another embodiment of the present invention, the magnitude of +ΔV1 is equal to the magnitude of −ΔV2 so that adjustable PMOS source voltage and the adjustable NMOS source voltage are adjusted symmetrically with respect to one-half of the fixed VDD supply voltage which is connected to the bulks.

According to still another embodiment of the present invention, the step of adjusting the adjustable PMOS source voltage increases the adjustable PMOS source voltage to a voltage level greater than the fixed VDD supply voltage.

According to yet another embodiment of the present invention, the step of adjusting the adjustable NMOS source voltage decreases the adjustable NMOS source voltage to a voltage level less than the fixed VSS supply voltage.

According to a further embodiment of the present invention, the PMOS source voltage and the NMOS source voltage are generated by a single-inductor, multiple-output (SIMO) boost regulator.

Technical advantages of one or more embodiments of the present invention include: 1) providing an improved method for reducing leakage current in integrated circuits, 2) allowing the use of higher efficiency switching regulators, and 3) requiring only one control loop. In a particular embodiment, adaptively adjusted source voltages are generated off-chip by decreasing a supply voltage and increasing a ground voltage, while the bodies are held at the rails. As a result, scaling for new technology is made easier. In addition, process-inherent sensitivities associated with on-chip methods are eliminated.

Other technical advantages will be readily apparent to one skilled in the art from the following figures, description, and claims.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged integrated circuit.

Figure 1:
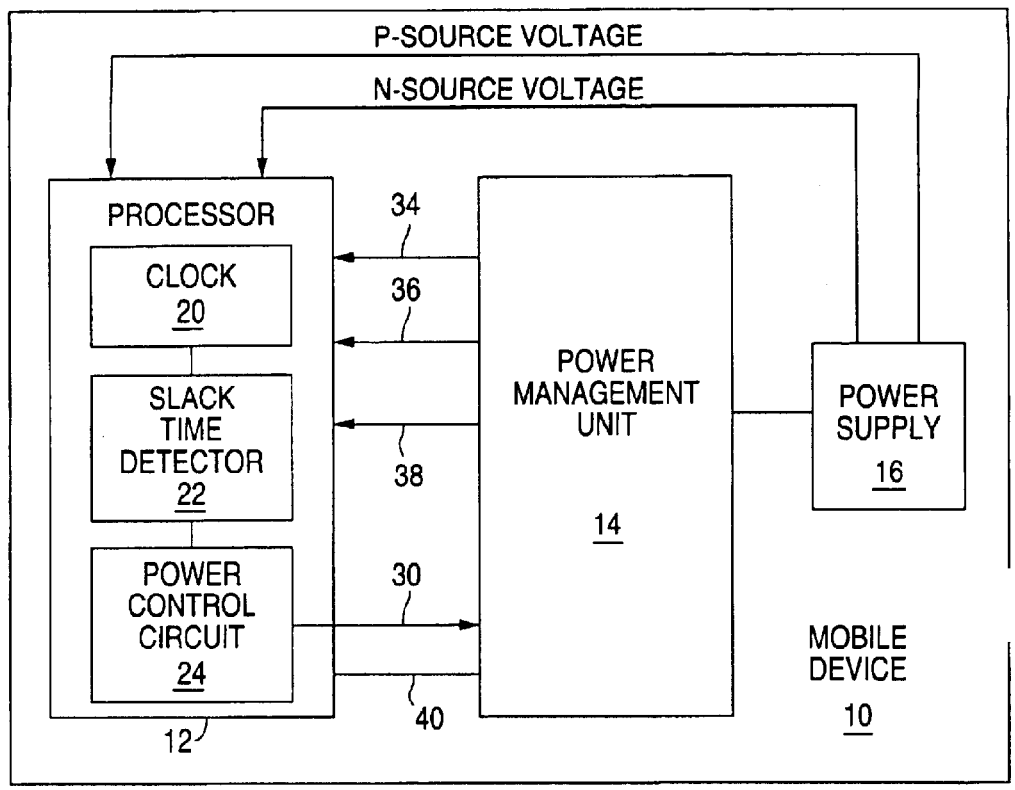
FIG. 1 is a block diagram illustrating a mobile device that is operable to minimize power consumption using adaptively adjusted source voltages and using cooperative adaptive voltage and threshold scaling in accordance with one embodiment of the present invention.

FIG. 1 is a block diagram illustrating a mobile device 10 that is operable to minimize power consumption using adaptively adjusted source voltages and using cooperative adaptive voltage and threshold scaling in accordance with one embodiment of the present invention. The mobile device 10 may comprise a mobile telephone, a personal digital assistant or any other suitable type of mobile device.

The mobile device 10 comprises a processor 12, a power management unit 14, and a power supply 16. The mobile device 10 also comprises other suitable components to enable its operation that are not illustrated in FIG. 1.

According to the illustrated embodiment, the processor 12 comprises a processor clock 20, a slack time detector 22, and a power control circuit 24. However, it will be understood that the power control circuit 24 may be separate from the processor 12 without departing from the scope of the present invention. For example, the power control circuit 24 may be a part of the power management unit 14. The processor clock 20 may comprise any suitable oscillator that is operable to generate a clock signal for components of the processor 12.

The slack time detector 22 is coupled to the processor clock 20 and is operable to receive the clock signal generated by the processor clock 20. The slack time detector 22 is also operable to monitor setup and hold times, or the slack time, corresponding to logic gates in the processor 12 based on the clock signal received from the processor clock 20. In addition, the slack time detector 22 is operable to generate power control signals based on the slack time for a specific clock frequency of the processor clock 20.

The power control circuit 24 is coupled to the slack time detector 22 and is operable to receive the power control signals from the slack time detector 22. Based on the power control signals, the power control circuit 24 is operable to generate a voltage control signal 30 for the power management unit 14. The voltage control signal 30 is operable to signal the power management unit 14 to adjust a supply voltage 34 and/or source voltages 36 and 38 in order to regulate the power use of the processor 12.

The processor 12 is operable to provide the supply voltage 34 to its logic gates in order to change the threshold voltages of the PMOS and NMOS devices, respectively, of the logic gates. The processor 12 is also operable to provide the source voltages 36 and 38 to its logic gates. The source voltage of each p-channel metal-oxide semiconductor field-effect transistor (MOSFET), or PMOS device, may be adjusted using the PMOS source voltage 36, and the source voltage of each n-channel MOSFET, or NMOS device, may be adjusted using the NMOS source voltage 38. As used herein, "each" means every one of at least a subset of the identified items.

The power management unit 14 is coupled to the processor 12 and to the power supply 16. The processor 12 and the power management unit 14 share a common ground 40, which may also be shared by the power supply 16. The power management unit 14 comprises circuitry that is operable to receive the voltage control signal 30 and to generate the supply voltage 34 and the source voltages 36 and 38 based on the voltage control signal 30 in order to minimize power consumption. The power management unit 14 is also operable to provide these voltages 34, 36 and 38 to the processor 12.

Power management unit 14 is operable to generate the source voltages 36 and 38 based on the supply voltage 34 and ground 40, respectively. In order to accomplish this, the power management unit 14 may comprise a control loop using an inductor with a switched capacitor commutating or bilinear switching.

According to one embodiment, the mobile device 10 comprises a plurality of power management units 14, each of which is operable to minimize power consumption for a corresponding component. For example, a memory of the processor 12 may have a first power management unit 14 that is operable to minimize power consumption for the memory, a multiplier may have a second power management unit 14 that is operable to minimize power consumption for the multiplier, and so on. For this embodiment, each of the components may also have a corresponding slack time detector 22 that is operable to monitor the slack time for the component.

The power supply 16 comprises a battery or other suitable device capable of providing a specified power supply voltage to the power management unit 14. According to one embodiment, the power supply 16 is operable to provide about 0.9 to about 1.2 volts to the power management unit 14, while the ground 40 is operable to provide about 0 volts. However, it will be understood that the power supply 16 may provide any suitable power supply potential, and the ground 40 may provide any suitable potential less than the potential provided by the power supply 16.

In operation, the power management unit 14 provides the supply voltage 34, the PMOS source voltage 36 and the NMOS source voltage 38 to the processor 12. The slack time detector 22 receives the clock signal from the processor clock 20 and receives the voltages 34, 36 and 38 from the power management unit 14. Based on these, the slack time detector 22 generates power control signals for the power control circuit 24. The power control circuit 24 receives the power control signals from the slack time detector 22 and generates the voltage control signal 30 for the power management unit 14. The power management unit 14 receives the voltage control signal 30 and generates the supply voltage 34, the PMOS source voltage 36 and the NMOS source voltage 38 for the processor 12 based on the voltage control signal 30. In addition, the source voltages 36 and 38 are generated based on the supply voltage 34 and ground 40.

Thus, in this way, the supply voltage 34, the PMOS source voltage 36 and the NMOS source voltage 38 may be adjusted based on the clock frequency of the processor clock 20 and the clock frequency may be adjusted based on the supply voltage 34. Thus, for example, if the clock frequency changes, the optimum supply voltage 34, PMOS source voltage 36 and NMOS source voltage 38 for meeting timing constraints and minimizing power consumption over all operating modes for the mobile device 10 are determined based on the new clock frequency and provided to the processor 12 for operation.

Similarly, if the supply voltage 34 for the mobile device 10 changes, such as may occur when the power supply 16 begins to lose power, the supply voltage 34, the PMOS source voltage 36 and the NMOS source voltage 38 provided to the processor 12 may be adjusted, causing a change in the clock frequency for the processor clock 20.

Figure 2:
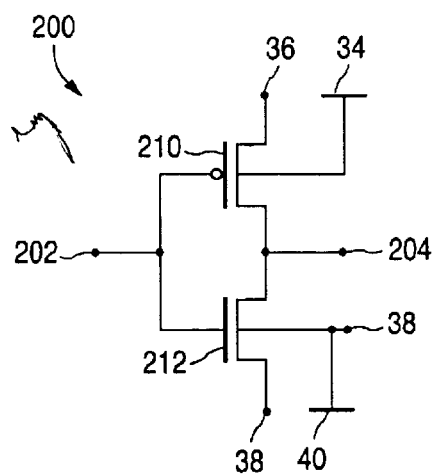
FIG. 2 is a circuit diagram illustrating a logic gate in the processor of FIG. 1 that is operable to use adaptively adjusted source voltages in accordance with one embodiment of the present invention.

FIG. 2 is a circuit diagram illustrating a logic gate 200 in the processor 12 that is operable to use adaptively adjusted source voltages in accordance with one embodiment of the present invention. The illustrated logic gate 200, which is an example of one type of logic gate that may be included in the processor 12, comprises an inverter. However, in addition to static logic gates, such as the logic gate 200, it will be understood that the logic gates included in the processor 12 may also comprise dynamic, domino or any other suitable types of logic gates without departing from the scope of the present invention.

The logic gate 200 is operable to receive an input signal 202 and to generate an output signal 204 based on the input signal 202. For the illustrated embodiment in which the logic gate 200 comprises an inverter, the input signal 202 is inverted in order to generate the output signal 204.

The logic gate 200 comprises a PMOS device 210 and an NMOS device 212. The PMOS and NMOS devices 210 and 212 each comprise triple-well devices. The PMOS device 210 comprises a bulk (or body) that is coupled to the supply voltage 34, a gate that is coupled to the input signal 202, a drain that is coupled to the output signal 204, and a source that is coupled to the PMOS source voltage 36. The NMOS device 212 comprises a body that is coupled to ground 40, a gate that is coupled to the input signal 202, a drain that is coupled to the output signal 204 and to the drain of the PMOS device 210, and a source that is coupled to the NMOS source voltage 38.

The logic gate 200 is operable to function using a variable supply voltage 34 and variable source voltages 36 and 38 generated by the power management unit 14 based on the voltage control signal 30. For example, the supply voltage 34 may be reduced during higher frequency modes in order to reduce dynamic power consumption, while the PMOS source voltage 36 may be decreased and the NMOS source voltage 38 may be increased during lower frequency modes in order to reduce static power consumption. In this way, the power consumption of the logic gate 200, in conjunction with the other logic gates of the processor 12, may be minimized across all operating modes and the leakage current may be reduced.

The operation of power management unit 14 may be described as follows. The power management unit 14 receives a supply is voltage 34 (i.e., VDD) and ground 40. For one embodiment, the power management unit 14 receives the supply voltage 34 and ground 40 from the power supply 16. The power management unit 14 generates the PMOS source voltage 36 based on the supply voltage 34 and generates the NMOS source voltage 38 based on ground 40.

For example, the power management unit 14 may generate the PMOS source voltage 36 by decreasing the supply voltage 34 by a specified amount and may generate the NMOS source voltage 38 by increasing the ground 40 by a specified amount. In an exemplary embodiment, the supply voltage 34 provides a VDD=+1.0 volt reference and the ground 40 provides a 0 volt reference.

The power management unit 14 provides the supply voltage 34 to the processor 12, which provides the supply voltage 34 (i.e., VDD=+1.0 volt) to the bulks (i.e., bodies) of its PMOS devices, including PMOS device 210. The power management unit 14 provides the ground 40 to the processor 12, which provides the ground to the bulks of its NMOS devices, including the NMOS device 212.

The power management unit 14 also provides the PMOS source voltage 36 to the processor 12, which provides the PMOS source voltage 36 to the sources of its PMOS devices. The power management unit 14 provides the NMOS source voltage 38 to the processor 12, which provides the NMOS source voltage 38 to the sources of its NMOS devices. According to an exemplary embodiment of the present invention, the values of the PMOS source voltage 36 and the NMOS source voltage 38 are symmetric is about the VDD/2 value. For example, if VDD=+1.0 volts, then the PMOS voltage 36 may be equal to +0.75 volts and the NMOS voltage 38 may be equal to +0.25 volts.

As described in more detail above in connection with FIG. 1, the power control circuit 24 is operable to regulate the power use of the processor 12 by generating, based on the voltages 34, 36 and 38 used in the processor 12, the voltage control signal 30 in order to signal the power management unit 14 to adjust those voltages 34, 36 and 38 when appropriate. Thus, the source voltages 36 and 38 may be adaptively adjusted in the integrated circuits of the processor 12, thereby reducing the leakage current in the integrated circuits.

Figure 3:
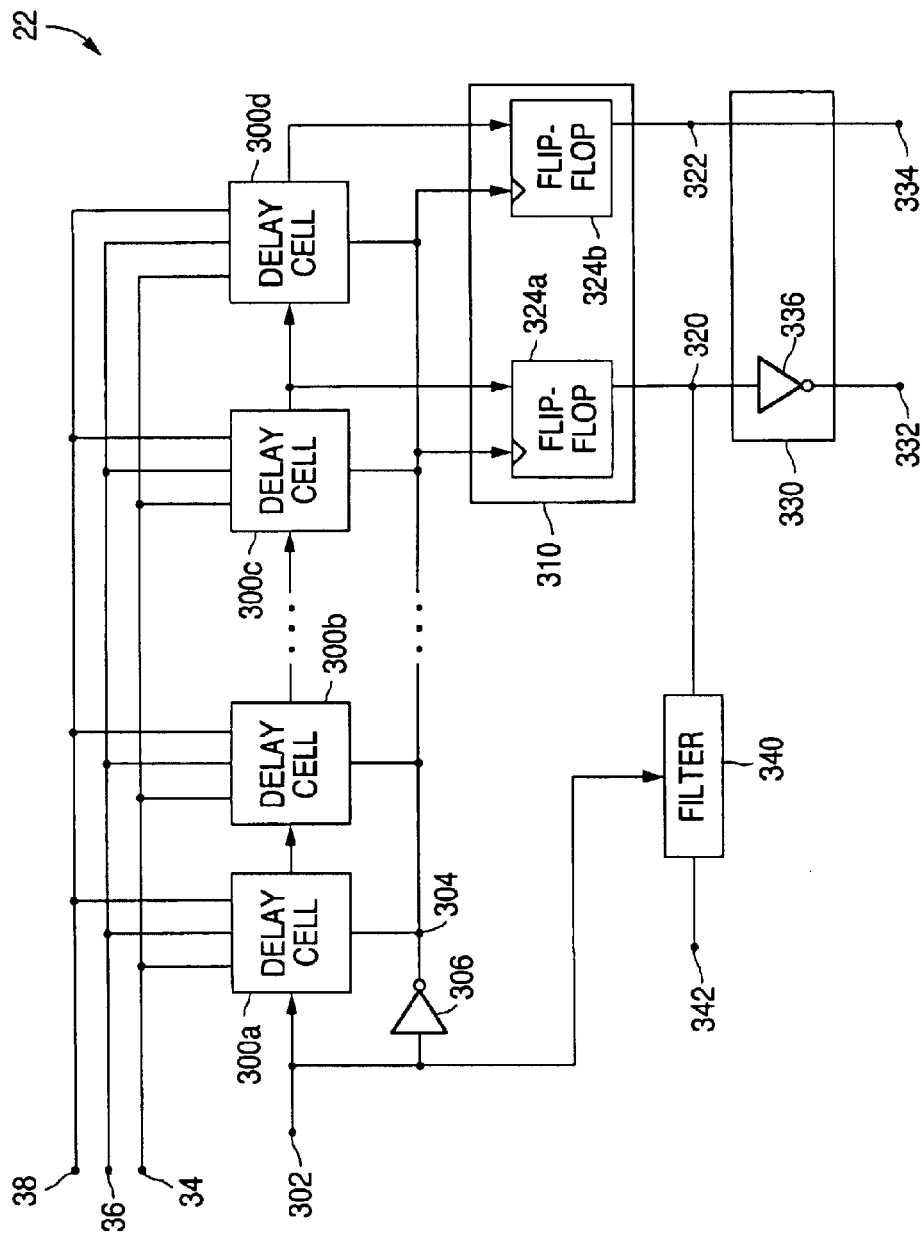
FIG. 3 is a block diagram illustrating the slack time detector of FIG. 1 in accordance with one embodiment of the present invention.

FIG. 3 is a block diagram illustrating the slack time detector 22 in accordance with one embodiment of the present invention. The illustrated slack time detector 22 comprises a delay line; however, it will be understood that the slack time detector 22 may comprise any suitable circuit operable to measure the response of logic gates in the processor 12 relative to the processor clock 20 without departing from the scope of the present invention.

The slack time detector 22 comprises a timing comparison circuit. According to the illustrated embodiment, the timing comparison circuit comprises a plurality of delay cells 300 that are operable to allow a measurement of timing requirements for the processor 12. For an alternative embodiment, the timing comparison circuit may comprise a replicated critical path, as opposed to the delay cells 300, that is operable to allow a measurement of timing requirements for the processor 12.

For the illustrated embodiment, each of the delay cells 300 are operable to receive the supply voltage 34 and the source voltages 36 and 38. In addition, an initial delay cell 300a is operable to receive a clock signal 302 from the processor clock 20. This clock signal 302 is operable to be processed through each of the delay cells 300 until the processing is halted by the delay cells 300 being reset. The delay cells 300 are operable to be reset by an inverted clock signal 304 that is generated by an inverter 306 coupled to the clock signal 302.

The slack time detector 22 also comprises a register 310 that is operable to receive the output from a first designated delay cell 300c and the output from a second designated delay cell 300d. Although the second designated delay cell 300d may be directly coupled to the first designated delay cell 300c, it will be understood that any suitable number of delay cells 300 may be coupled between the first and second designated delay cells 300c and 300d without departing from the scope of the present invention. The register 310 is also operable to generate a first status signal 320 based on the output from the first designated delay cell 300c and a second status signal 322 based on the output from the second designated delay cell 300d.

According to one embodiment, the register 310 comprises a pair of edge-triggered flip-flops 324, each of which is operable to receive the inverted clock signal 304 as a clock input. Thus, according to this embodiment, the first flip-flop 324a is operable to receive the output from the first designated delay cell 300c and to generate the first status signal 320 based on that output, and the second flip-flop 324b is operable to receive the output from the second designated delay cell 300d and to generate the second status signal 322 based on that output.

The slack time detector 22 also comprises a decoder 330 that is operable to receive the first and second status signals 320 and 322 and to generate first and second power control signals 332 and 334 based on the status signals 320 and 322. According to one embodiment, the decoder 300 comprises an inverter 336 that is operable to invert the first status signal 320 in order to generate the first power control signal 332, while the second power control signal 334 is simply the same signal as the second status signal 322.

The slack time detector 22 may also comprise a digital filter 340 that is operable to receive the clock signal 302 and the first status signal 320. The filter 340 is also operable to average a specified number of first status signals 320 in order to generate a steady clock signal 342. According to one embodiment, the filter 340 is operable to average from two to eight first status signals 320 in order to generate one steady clock signal 342. However, it will be understood that the filter 340 may be operable to average any suitable number of first status signals 320 in order to generate one steady clock signal 342 without departing from the scope of the present invention.

In operation, according to one embodiment, the delay cells 300 each receive the supply voltage 34, the PMOS source voltage 36, and the NMOS source voltage 38 from the power management unit 14. In addition, the initial delay cell 300a of the slack time detector 22 receives a rising clock edge for the clock signal 302 from the processor clock 20. This logic high input signal is provided to a subsequent delay cell 300b, and so on, until the inverted clock signal 304 provides a logic high when the clock signal 302 goes low.

This allows the register 310 to latch the output of the first designated delay cell 300c in the first flip-flop 324a and the output of the second designated delay cell 300d in the second flip-flop 324b. The output of the first flip-flop 324a, the first status signal, is provided to the filter 340 for averaging to generate the steady clock signal 342.

In addition, the first status signal 320 is inverted in the decoder 330 to generate the first power control signal 332, and the second status signal, which is the output from the second flip-flop 324b of the register 310, is provided as the second power control signal 334.

When the logic high from the rising edge of the clock signal 302 fails to reach the first designated delay cell 300c, the processor 12 requests more power from the power management unit 14 by generating a logic high for the first power control signal 332 and a logic low for the second power control signal 334.

When the logic high from the rising edge of the clock signal 302 reaches the first designated delay cell 300c but not the second designated delay cell 300d, the processor 12 is running under optimum conditions for meeting timing requirements and minimizing power consumption. In this case, the processor 12 requests no change in power from the power management unit 14 by generating a logic low for the first power control signal 332 and a logic low for the second power control signal 334.

Finally, when the logic high from the rising edge of the clock signal 302 reaches both the first and second designated delay cells 300c and 300d, the processor 12 requests less power from the power management unit 14 by generating a logic low for the first power control signal 332 and a logic high for the second power control signal 334.

In this way, a closed-loop configuration is implemented between the processor 12 and the power management unit 14, allowing continuous cooperation between the power management unit 14, the slack time detector 22 and the power control circuit 24 in order to determine and generate the optimum supply voltage 34, PMOS source voltage 36 and NMOS source voltage 38 for meeting timing constraints and minimizing power consumption over all operating modes for the processor 12.

Figure 4:
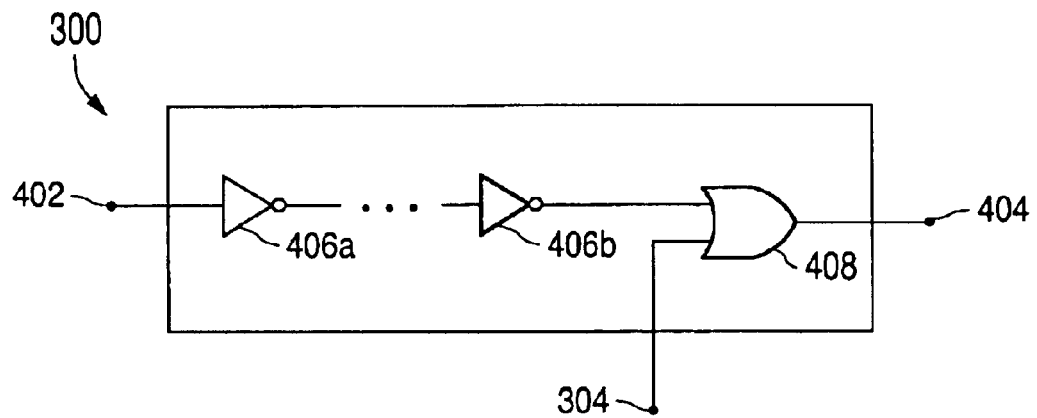
FIG. 4 is a circuit diagram illustrating one of the delay cells of FIG. 3 in accordance with one embodiment of the present invention.

FIG. 4 is a circuit diagram illustrating one of the delay cells 300 in accordance with one embodiment of the present invention. According to this embodiment, the delay cell 300 comprises an input terminal 402 that is operable to receive as an input signal the output signal from a previous delay cell 300 in the delay line or, in the case of the initial delay cell 300a, the clock signal 302. The delay cell 300 also comprises on output terminal 404 that is operable to provide an output signal for the input terminal of a subsequent delay cell 300 based on the input signal received at the input terminal 402.

According to one embodiment, the delay cell 300 also comprises one or more inverters 406 and a NOR gate 408. The NOR gate is coupled to the final inverter 406b and is operable to receive the output of the final inverter 406b, in addition to the inverted clock signal 304, which acts as a reset signal for the delay cell 300. The delay cell 300 comprises an odd number of inverters 406 such that the NOR gate 408 receives a signal that is inverted with respect to the input signal received at the input terminal 402.

Figure 5:
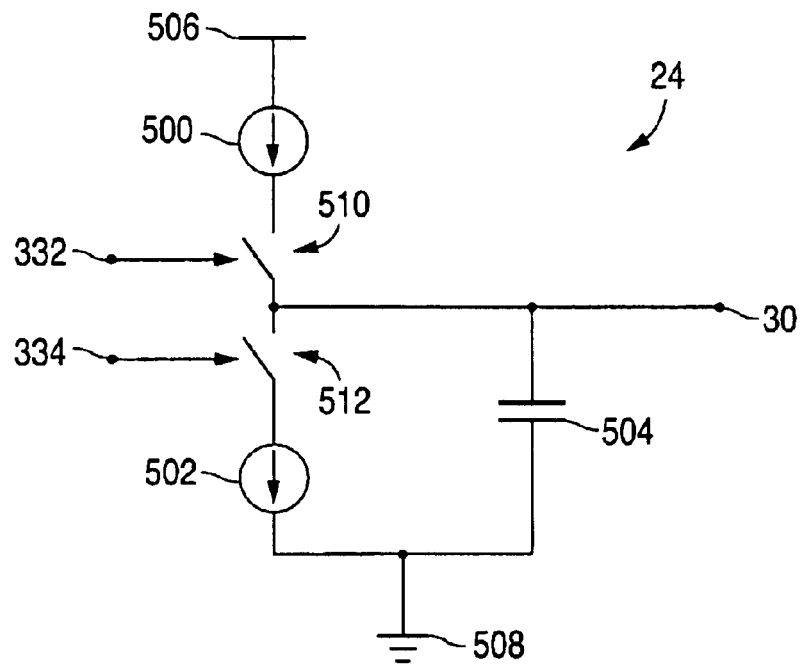
FIG. 5 is a circuit diagram illustrating the power control circuit of FIG. 1 in accordance with one embodiment of the present invention.

FIG. 5 is a circuit diagram illustrating the power control circuit 24 in accordance with one embodiment of the present invention. The power control circuit 24 is operable to receive the first power control signal 332 and the second power control signal 334 and to generate the voltage control signal 30 based on the power control signals 332 and 334.

According to this embodiment, the power control circuit 24 comprises a power up current source 500, a power down current source 502, and a capacitor 504. The power up current source 500 is operable to pump up the capacitor 504, and the power down current source 502 is operable to pull down the capacitor 504. The power control circuit 24 also comprises an input potential 506, which may correspond to the supply voltage 34, and a ground 508, which may correspond to the ground 40 for the processor 12.

The power up current source 500 is coupled to the input potential 506 and may be coupled to the capacitor 504 through a switch 510. According to one embodiment, the switch 510 comprises a high breakdown, vertical metal-oxide semiconductor structure, such as a depletion metal-oxide semiconductor (DMOS) switch. However, it will be understood that the switch 510 may comprise any suitable switch without departing from the scope of the present invention.

The switch 510 is operable to be opened or closed based on the first power control signal 332. Thus, for a first power control signal 332 corresponding to a request for more power, the switch 510 may be closed, allowing the power up current source 500 to pump up the capacitor 504. Similarly, for a first power control signal 332 corresponding to no request for more power, the switch 510 may be opened such that the current source 500 is uncoupled from the capacitor 504.

A first terminal of the power down current source 502 is coupled to the ground 508 and to the capacitor 504. A second terminal of the power down current source 502 may be coupled to the capacitor 504 through a switch 512. According to one embodiment, the switch 512 comprises a high breakdown, vertical metal-oxide semiconductor structure, such as a DMOS switch. However, it will be understood that the switch 512 may comprise any suitable switch without departing from the scope of the present invention.

The switch 512 is operable to be opened or closed based on the second power control signal 334. Thus, for a second power control signal 334 corresponding to a request for less power, the switch 512 may be closed, allowing the power down current source 502 to pull down the capacitor 504. Similarly, for a second power control signal 334 corresponding to no request for less power, the switch 512 may be opened such that the second terminal of the current source 502 is uncoupled from the capacitor 504. This circuit could also be replaced with a DAC without departing from the scope of the present invention. The purpose of the block is to convert the slack-time delay into a voltage reference that provides a closed loop feedback mechanism that adjusts the voltage to maintain a fixed delay.

Figure 6:
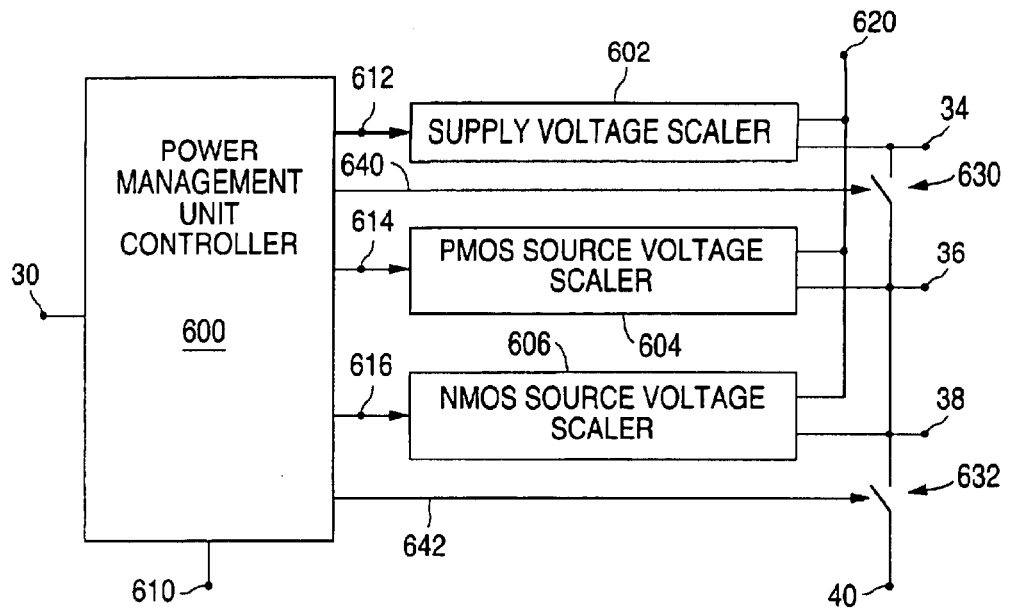
FIG. 6 is a block diagram illustrating the power management unit of FIG. 1 in accordance with one embodiment of the present invention.

FIG. 6 is a block diagram illustrating the power management unit 14 in accordance with one embodiment of the present invention. The power management unit 14 is operable to receive the voltage control signal 30 from the power control circuit 24 and to generate the supply voltage 34, the PMOS source voltage 36, and the NMOS source voltage 38 based on the voltage control signal 30. According to this embodiment, the power management unit 14 comprises a power management unit controller 600, a supply voltage scaler 602, a PMOS source voltage scaler 604, and an NMOS source voltage scaler 606.

The power management unit controller 600 is operable to receive the voltage control signal 30 and a reference signal 610. The reference signal 610 may comprise a bandgap reference voltage, a clock reference signal, or any other suitable signal operable to provide a reference for the power management unit controller 600. Based on the voltage control signal 30 and the reference signal 610, the power management unit controller 600 generates a supply voltage reference signal 612 for the supply voltage scaler 602, a PMOS source voltage reference signal 614 for the PMOS source voltage scaler 604, and an NMOS source voltage reference signal 616 for the NMOS source voltage scaler

606. The scalers 602, 604 and 606 are also operable to receive a power supply voltage 620, which may correspond to the power supply 16 for the mobile device 10.

Based on the reference signals 612, 614 and 616, in addition to the power supply voltage 620, the supply voltage scaler 602, the PMOS source voltage scaler 604, and the NMOS source voltage scaler 606 are operable to generate the supply voltage 34, the PMOS source voltage 36, and the NMOS source voltage 38, respectively.

According to one embodiment, the supply voltage scaler 602 comprises a high frequency, high efficiency, switching power supply and the PMOS source voltage scaler 604 and the NMOS source voltage scaler 606 comprise a control loop using an inductor with a switched capacitor commutating or bilinear switching. However, it will be understood that the scalers 602, 604 and 606 may comprise any other suitable components operable to generate the voltages 34, 36 and 38 based on the reference signals 612, 614 and 616 without departing from the scope of the present invention.

At least a portion of the scalers 602, 604 and 606 may comprise logic encoded in media. The logic comprises functional instructions for carrying out program tasks. The media comprises computer disks or other computer-readable media, application-specific integrated circuits, field-programmable gate arrays, digital signal processors, other suitable specific or general purpose processors, transmission media or other suitable media in which logic may be encoded and utilized.

The power management unit 14 also comprises a PMOS switch 630 and an NMOS switch 632. According to one embodiment, the switches 630 and 632 each comprise a high breakdown, vertical metal-oxide semiconductor structure, such as a DMOS switch. However, it will be understood that the switches 630 and 632 may each comprise any suitable switch without departing from the scope of the present invention.

The power management unit 14 is operable to place the mobile device 10 into an open operating mode by opening the switches 630 and 632 and into a closed operating mode by closing the switches 630 and 632. Based on the voltage control signal 30, the power management unit controller 600 is operable to provide a PMOS switch signal 640 to the PMOS switch 630 and an NMOS switch signal 642 to the NMOS switch 632. These switch signals 640 and 642 are operable to either open or close the corresponding switches 630 and 632. It will be understood that the switch signals 640 and 642 may comprise a single signal provided to both switches 630 and 632.

Thus, when the mobile device 10 is in the open mode, the PMOS source voltage scaler 604 generates the PMOS source voltage 36 and the NMOS source voltage scaler 606 generates the NMOS source voltage 38. When the mobile device 10 is in the closed mode, the PMOS source voltage 36 is the same as the supply voltage 34, which is generated by the supply voltage scaler 602, and the NMOS source voltage 38 is the same as ground 40. Therefore, in the open mode, any of the voltages 34, 36 and 38 may be adjusted independently, while in the closed mode, the supply voltage 34 may be adjusted, with the PMOS source voltage 36 tracking the supply voltage 34 and the NMOS source voltage 38 remaining at ground 40.

Figure 7:
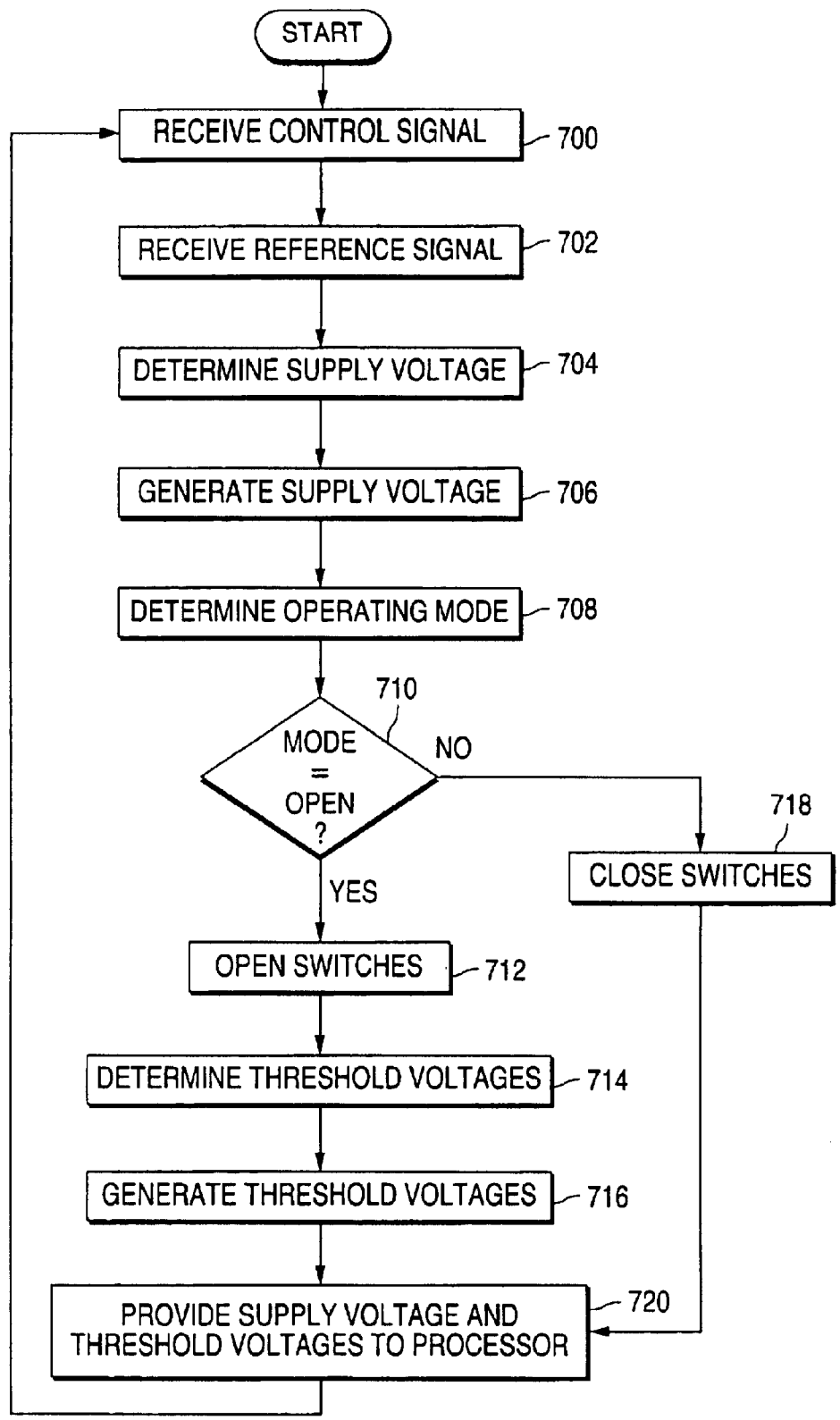
FIG. 7 is a flow diagram illustrating a method for adaptively adjusting source voltages in integrated circuits in accordance with one embodiment of the present invention.

FIG. 7 is a flow diagram illustrating a method for adaptively adjusting source voltages in integrated circuits in accordance with one embodiment of the present invention. The method begins at step 700 where the voltage control signal 30 is received from the power control circuit 24. At step 702, the reference signal 610 is received.

At step 704, the supply voltage 34 is determined by the supply voltage scaler 602 based on the supply voltage reference signal 612 generated by the power management unit controller 600. At step 706, the supply voltage 34 is generated by the power management unit 14. At step 708, the power management unit controller 600 determines into which operating mode the mobile device 10 is to be placed based on the voltage control signal 30.

At decisional step 710, a determination is made regarding whether or not the operating mode is open. If the operating mode is open, the method follows the Yes branch from decisional step 710 to step 712. At step 712, the power management unit controller 600 generates switch signals 640 and 642 to open the switches 630 and 632, respectively.

At step 714, the PMOS source voltage 36 is determined by the PMOS source voltage scaler 604 based on the PMOS source voltage reference signal 614 generated by the power management unit controller 600, and the NMOS source voltage 38 is determined by the NMOS source voltage scaler 606 based on the NMOS source voltage reference signal 616 generated by the power management unit controller 600.

At step 716, the source voltages 36 and 38 are generated by the power management unit 14. According to one embodiment, the source voltages 36 and 38 are generated based on the supply voltage 34 and ground 40, respectively.

Returning to decisional step 710, if the operating mode is not open, the method follows the No branch from decisional step 710 to step 718. At step 718, the power management unit controller 600 generates switch signals 640 and 642 to close the switches 630 and 632, respectively.

From steps 716 and 718, the method continues to step 720. At step 720, the power management unit 14 provides the supply voltage 34, the PMOS source voltage 36 and the NMOS source voltage 38 to the processor 12.

In this way, a closed-loop configuration is implemented between the power management unit 14 and the processor 12, allowing continuous cooperation between the power management unit 14, the slack time detector 22 and the power control circuit 24 in order to determine and generate the optimum supply voltage 34, PMOS source voltage 36 and NMOS source voltage 38 for meeting timing constraints and minimizing power consumption over all operating modes for the processor 12.

Figure 8:
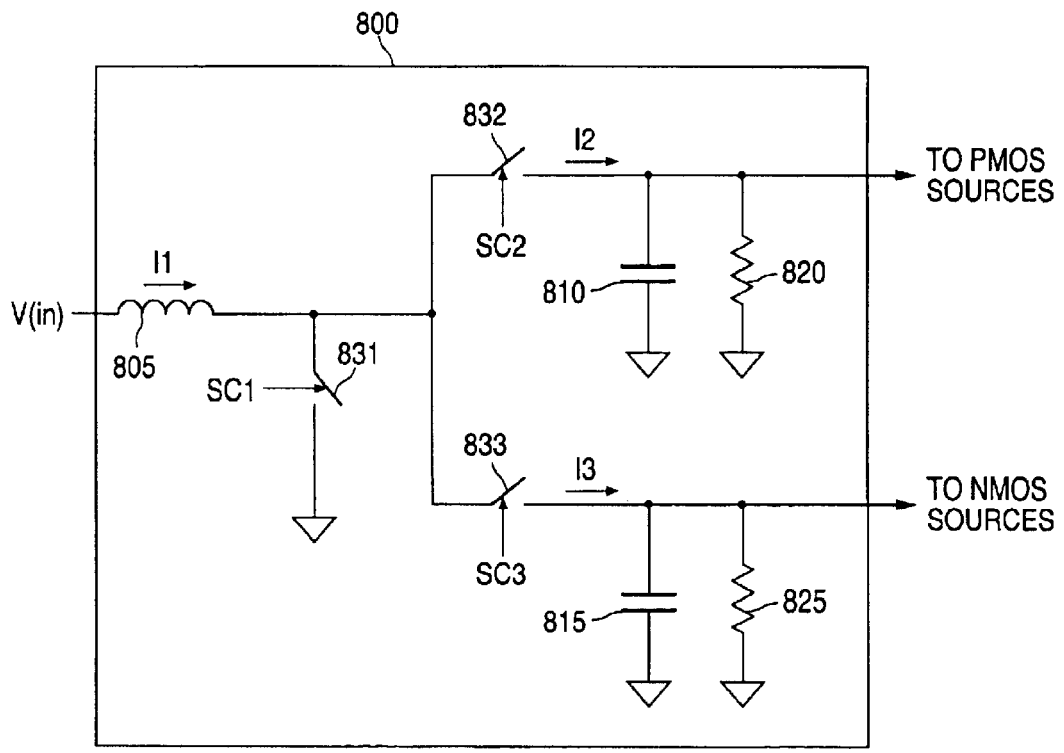
FIG. 8 is a circuit diagram illustrating a single inductor multiple output (SIMO) variable power supply that may be used to generate the variable source voltages according to one embodiment of the present invention.

FIG. 8 is a circuit diagram illustrating a variable power supply 800 that may be used to generate the variable source voltages according to a preferred embodiment of the present invention. Variable power supply 800, which may be a part of power management unit 14, is based on a single inductor, multiple output (SIMO) boost regulator. The SIMO buck boost regulator comprises inductor 805, capacitor 810, capacitor 815, load 820, load 825 and switches 831, 832, and 833. SIMO boost regulators are well-known to those of ordinary skill in the art and need not be explained in great detail herein. A more detailed explanation of a SIMO boost regulator is given in U.S. Pat. No. 6,075,295, entitled "Single Inductor Multiple Output Boost Regulator." The teachings of U.S. Pat. No. 6,075,295 are hereby incorporated into the present disclosure for all purposes.

Switches 831, 832 and 833 control the operation of variable power supply 800. Switch control (SC) signals SC1, SC2, and SC3 open and close switches 831, 832, and 833, respectively. Initially, switches 832 and 833 are open and switch 831 is closed. While switch 831 is closed, one end of inductor 805 is connected to the DC voltage, V(in), and the other end of inductor 805 is shorted to ground. Under these conditions, a relatively large current, 1, builds up in inductor 805.

When switch 831 is opened, current I1 is forced to flow through switch 832 and 833 or both, depending on whether or not is switches 832 and 833 are closed. The current I2 through switch 832 charges capacitor 810 and establishes a voltage across load resistor 820 that is equal to the desired source voltage applied to PMOS source voltage 36. Similarly, the current I2 through switch 833 charges capacitor 810 and establishes a voltage across load resistor 825 that is equal to the desired source voltage applied to NMOS source voltage 38. A controller (not shown) monitors the voltages on capacitors 810 and 815 and selectively opens and closes switches 831, 832 and 833 in order to keep PMOS source voltage 36 and NMOS source voltage 38 at the desired target levels.

According to an exemplary embodiment of the present invention, variable power supply 800 symmetrically references the PMOS source voltage 36 and NMOS source voltage 38 to the value VDD/2. For example, if supply voltage 34 supplies a voltage VDD=+1.0 volts to the bulk of PMOS device 210, then VDD=0.5 volts. Variable power supply 800 may set the PMOS source voltage 36 to +0.75 volts and may set the NMOS voltage 38 to +0.25 volts. Thereafter, during normal operation, variable power supply 800 adjusts PMOS source voltage 36 and NMOS voltage 38 according to the operating conditions of processor 12, as explained above. Variable power supply 800 may even adjust PMOS source voltage 36 and NMOS voltage 38 beyond the voltage levels of the VDD and ground rails. For example, variable power supply 800 may increase PMOS source voltage 36 to +1.1 volts when VDD=+1.0 volts.

Although the present invention has been described with several embodiments, various changes and modifications may be suggested to one skilled in the art. It is intended that the present invention encompass such changes and modifications as fall within the scope of the appended claims.

What is claimed is:

1. A method for reducing leakage current in integrated circuits using adaptively adjusted source voltages, the integrated circuits comprising one or more PMOS devices and one or more NMOS devices, the method comprising:
   applying an adjustable VDD supply voltage to bodies of the one or more PMOS devices;
   applying a VSS supply voltage to bodies of the one or more NMOS devices;
   generating an adjustable PMOS source voltage using the adjustable VDD supply voltage:
   applying the adjustable PMOS source voltage to sources of the one or more PMOS devices;
   applying an adjustable NMOS source voltage to sources of the one or more NMOS devices; and
   adjusting at least one of: the adjustable VDD supply voltage, the adjustable PMOS source voltages, and the adjustable NMOS source voltage.

2. A method for reducing leakage current in integrated circuits using adaptively adjusted source voltages, the integrated circuits comprising one or more PMOS devices and one or more NMOS devices, the method comprising:
   applying a fixed VDD supply voltage to bodies of the one or more PMOS devices;
   applying a fixed VSS supply voltage to bodies of the one or more NMOS devices;
   applying an adjustable PMOS source voltage to sources of the one or more PMOS devices;
   applying an adjustable NMOS source voltage to sources of the one or more NMOS devices; and
   adjusting the adjustable PMOS source voltage to a first bias voltage that is +$\Delta$V1 volts above one-half of the fixed VDD supply voltage.

3. The method as set forth in claim 2 further comprising the step of adjusting the adjustable NMOS source voltage to a second bias voltage that is -$\Delta$V2 volts below one-half of the fixed VDD supply.

4. The method as set forth in claim 3 wherein the magnitude of +$\Delta$V1 is equal to the magnitude of -$\Delta$V2 so that adjustable PMOS source voltage and the adjustable NMOS source voltage are adjusted symmetrically with respect to one-half of the fixed VDD supply voltage.

5. The method as set forth in claim 3 wherein the step of adjusting the adjustable PMOS source voltage increases the adjustable PMOS source voltage to a voltage level greater than the fixed VDD supply voltage.

6. The method as set forth in claim 3 wherein the step of adjusting the adjustable NMOS source voltage decreases the adjustable NMOS source voltage to a voltage level less than the fixed VSS supply voltage.

7. A method for reducing leakage current in integrated circuits using adaptively adjusted source voltages, the integrated circuits comprising one or more PMOS devices and one or more NMOS devices, the method comprising:
   applying a fixed VDD supply voltage to bodies of the one or more PMOS devices;
   applying a fixed VSS supply voltage to bodies of the one or more NMOS devices;
   applying an adjustable PMOS source voltage to sources of the one or more PMOS devices; and
   applying an adjustable NMOS source voltage to sources of the one or more NMOS devices;
   wherein the adjustable PMOS source voltage and the adjustable NMOS source voltage are generated by a single inductor, multiple output (SIMO) boost regulator.

8. An apparatus for reducing leakage currents in an integrated circuit comprising a plurality of logic gates containing one or more PMOS devices and one or more NMOS devices, said apparatus comprising:
   a power management unit capable of:
      applying an adjustable VDD supply voltage to body connections of said one or more PMOS devices;
      applying a VSS supply voltage to body connections of said one or more NMOS devices;
      generating an adjustable PMOS source voltage using the adjustable VDD supply voltage:
      applying the adjustable PMOS source voltage to sources of said one or more PMOS devices;
      applying an adjustable NMOS source voltage to sources of said one or more NMOS devices; and
   adjusting at least one of: the adjustable VDD supply voltage, the adjustable PMOS source voltage, and the adjustable NMOS source voltage.

9. An apparatus for reducing leakage currents in an integrated circuit comprising a plurality of logic gates containing one or more PMOS devices and one or more NMOS devices, said apparatus comprising:
   a power management unit capable of: i) applying a fixed VDD supply voltage to body connections of said one or more PMOS devices; ii) applying a fixed VSS supply voltage to body connections of said one or more NMOS devices; iii) applying an adjustable PMOS source voltage to sources of said one or more PMOS devices; and iv) applying an adjustable NMOS source voltage to sources of said one or more NMOS devices;

wherein said power management unit adjusts the adjustable PMOS source voltage to a first bias voltage that is $+\Delta V1$ volts above one-half of the fixed VDD supply voltage.

10. The apparatus as set forth in claim 9 wherein said power management unit adjusts the adjustable NMOS source voltage to a second bias voltage that is $-\Delta V2$ volts below one-half of the fixed VDD supply.

11. The apparatus as set forth in claim 10 wherein the magnitude of $+\Delta V1$ is equal to the magnitude of $-\Delta V2$ so that wherein said power management unit adjusts the adjustable PMOS source voltage and the adjustable NMOS source voltage symmetrically with respect to one-half of the fixed VDD supply voltage.

12. The apparatus as set forth in claim 10 wherein said power management unit increases the adjustable PMOS source voltage to a voltage level greater than the fixed VDD supply voltage.

13. The apparatus as set forth in claim 10 wherein said power management unit decreases the adjustable NMOS source voltage to a voltage level less than the fixed VSS supply voltage.

14. An apparatus for reducing leakage currents in an integrated circuit comprising a plurality of logic gates containing one or more PMOS devices and one or more NMOS devices, said apparatus comprising:
a power management unit capable of: i) applying a fixed VDD supply voltage to body connections of said one or more PMOS devices; ii) applying a fixed VSS supply voltage to body connections of said one or more NMOS devices; iii) applying an adjustable PMOS source voltage to sources of said one or more PMOS devices; and iv) applying an adjustable NMOS source voltage to sources of said one or more NMOS devices;
wherein said power management unit comprises a single inductor, multiple output (SIMO) boost regulator that generates the adjustable PMOS source voltage and the adjustable NMOS source voltage.

15. A processing system comprising:
a data processor comprising a plurality of logic gates containing one or more PMOS devices and one or more NMOS devices; and
an apparatus for reducing leakage currents in said plurality of logic gates containing said one or more PMOS devices and said one or more NMOS devices, said apparatus comprising a power management unit capable of:
applying an adjustable VDD supply voltage to body connections of said one or more PMOS devices;
applying a VSS supply voltage to body connections of said one or more NMOS devices;
generating an adjustable PMOS source voltage using the adjustable VDD supply voltage;
applying the adjustable PMOS source voltage to sources of said one or more PMOS devices;
applying an adjustable NMOS source voltage to sources of said one or more NMOS devices; and
adjusting at least one of: the adjustable VDD supply voltage, the adjustable PMOS source voltage, and the adjustable NMOS source voltage.

16. A processing system comprising:
a data processor comprising a plurality of logic gates containing one or more PMOS devices and one or more NMOS devices; and
an apparatus for reducing leakage currents in said plurality of logic gates containing said one or more PMOS devices and said one or more NMOS devices, said apparatus comprising:
a power management unit capable of: i) applying a fixed VDD supply voltage to body connections of said one or more PMOS devices; ii) applying a fixed VSS supply voltage to body connections of said one or more NMOS devices; iii) applying an adjustable PMOS source voltage to sources of said one or more PMOS devices; and iv) applying an adjustable NMOS source voltage to sources of said one or more NMOS devices;
wherein said power management unit adjusts the adjustable PMOS source voltage to a first bias voltage that is $+\Delta V1$ volts above one-half of the fixed VDD supply voltage.

17. The processing system as set forth in claim 16 wherein said power management unit adjusts the adjustable NMOS source voltage to a second bias voltage that is $-\Delta V2$ volts below one-half of the fixed VDD supply.

18. The processing system as set forth in claim 17 wherein the magnitude of $+\Delta V1$ to the magnitude of $-\Delta V2$ so that wherein said power management unit adjusts the adjustable PMOS source voltage and the adjustable NMOS source voltage symmetrically with respect to one-half of the fixed VDD supply voltage.

19. The processing system as set forth in claim 17 wherein said power management unit increases the adjustable PMOS source voltage to a voltage level greater than the fixed VDD supply voltage.

20. The processing system as set forth in claim 17 wherein said power management unit decreases the adjustable NMOS source voltage to a voltage level less than the fixed VSS supply voltage.

21. A processing system comprising:
a data processor comprising a plurality of logic gates containing one or more PMOS devices and one or more NMOS devices; and
an apparatus for reducing leakage currents in said plurality of logic gates containing said one or more PMOS devices and said one or more NMOS devices, said apparatus comprising:
a power management unit capable of: i) applying a fixed VDD supply voltage to body connections of said one or more PMOS devices; ii) applying a fixed VSS supply voltage to body connections of said one or more NMOS devices; iii) applying an adjustable PMOS source voltage to sources of said one or more PMOS devices; and iv) applying an adjustable NMOS source voltage to sources of said one or more NMOS devices;
wherein said power management unit comprises a single inductor, multiple output (SIMO) buck boost regulator that generates the adjustable PMOS source voltage and the adjustable NMOS source voltage.

* * * * *

UNITED STATES PATENT AND TRADEMARK OFFICE
CERTIFICATE OF CORRECTION

| | | |
|---|---|---|
| PATENT NO. | : 6,927,619 B1 | Page 1 of 1 |
| APPLICATION NO. | : 10/313806 | |
| DATED | : August 9, 2005 | |
| INVENTOR(S) | : James T. Doyle | |

It is certified that error appears in the above-identified patent and that said Letters Patent is hereby corrected as shown below:

Column 12, line 66, delete "1" and replace with --11--;

Column 13, line 3, delete "is".

Signed and Sealed this

Seventeenth Day of October, 2006

JON W. DUDAS
*Director of the United States Patent and Trademark Office*